(12) United States Patent
Baker (10) Patent No.: US 7,616,474 B2
(45) Date of Patent: Nov. 10, 2009

(54) OFFSET COMPENSATED SENSING FOR MAGNETIC RANDOM ACCESS MEMORY

(75) Inventor: R. Jacob Baker, Boise, ID (US)

(73) Assignee: Micron Technology Inc., Boise, ID (US)

( * ) Notice: Subject to any disclaimer, the term of this patent is extended or adjusted under 35 U.S.C. 154(b) by 11 days.

(21) Appl. No.: 11/898,890

(22) Filed: Sep. 17, 2007

(65) Prior Publication Data

US 2008/0089119 A1    Apr. 17, 2008

Related U.S. Application Data

(60) Continuation of application No. 11/377,683, filed on Mar. 17, 2006, now Pat. No. 7,286,428, which is a division of application No. 11/133,236, filed on May 20, 2005, now Pat. No. 7,082,045, which is a division of application No. 10/828,162, filed on Apr. 21, 2004, now Pat. No. 6,917,534, which is a division of application No. 10/422,850, filed on Apr. 25, 2003, now Pat. No. 6,856,532, which is a division of application No. 09/938,722, filed on Aug. 27, 2001, now Pat. No. 6,597,600.

(51) Int. Cl.
G11C 11/00 (2006.01)
(52) U.S. Cl. ............... 365/148; 365/158; 365/189.11
(58) Field of Classification Search ............. 365/148, 365/158, 189.11
See application file for complete search history.

(56) References Cited

U.S. PATENT DOCUMENTS

| | | | |
|---|---|---|---|
| 5,389,778 A | 2/1995 | Shinomiya | |
| 6,166,944 A | 12/2000 | Ogino | |
| 6,256,224 B1 * | 7/2001 | Perner et al. | 365/173 |
| 6,262,625 B1 | 7/2001 | Perner et al. | |
| 6,388,917 B2 | 5/2002 | Hoffman et al. | |
| 6,396,733 B1 | 5/2002 | Lu et al. | |
| 6,462,600 B2 | 10/2002 | Pakriswamy | |
| 6,650,562 B2 | 11/2003 | Holden et al. | |

* cited by examiner

*Primary Examiner*—Huan Hoang
(74) *Attorney, Agent, or Firm*—Dickstein Shapiro LLP (57) ABSTRACT

An offset compensated memory element voltage supply including a differential amplifier with a compensation circuit, and a transistor with a gate connected to the output of the differential amplifier. The compensation circuit of the differential amplifier includes a compensation capacitor that stores a compensation voltage during a calibration phase, and applies the stored compensation voltage to a compensation input of the compensation circuit of the amplifier during a measurement phase. Feedback from a source of the transistor controls the output of the differential amplifier to maintain a standard voltage across a resistive memory element connected to the source during measurement of the resistance of the resistive memory element, and the compensation circuit improves the accuracy of the voltage across the resistive memory element by compensating for an offset voltage of the differential amplifier.

9 Claims, 11 Drawing Sheets

OFFSET COMPENSATED SENSING FOR MAGNETIC RANDOM ACCESS MEMORY

This application is a continuation of U.S. patent application Ser. No. 11/377,683, filed on Mar. 17, 2006, now U.S. Pat. No. 7,286,428 which is a divisional application of U.S. patent application Ser. No. 11/133,236, filed on May 20, 2005, now U.S. Pat. No. 7,082,045, which is a divisional of application Ser. No. 10/828,162, filed Apr. 21, 2004, now U.S. Pat. No. 6,917,534, which is a divisional of application Ser. No. 10/422,850, filed Apr. 25, 2003, now U.S. Pat. No. 6,856,532, which is a divisional of application Ser. No. 09/938,722, filed Aug. 27, 2001, now U.S. Pat. No. 6,597,600, the entirety of each of which is hereby incorporated by reference.

BACKGROUND OF THE INVENTION

1. Field of the Invention

The present invention relates to the field of resistor-based memory circuits. More particularly, it relates to a method for precisely regulating the voltage applied across a resistive memory element during sensing.

2. Description of the Related Art

Figure 1:
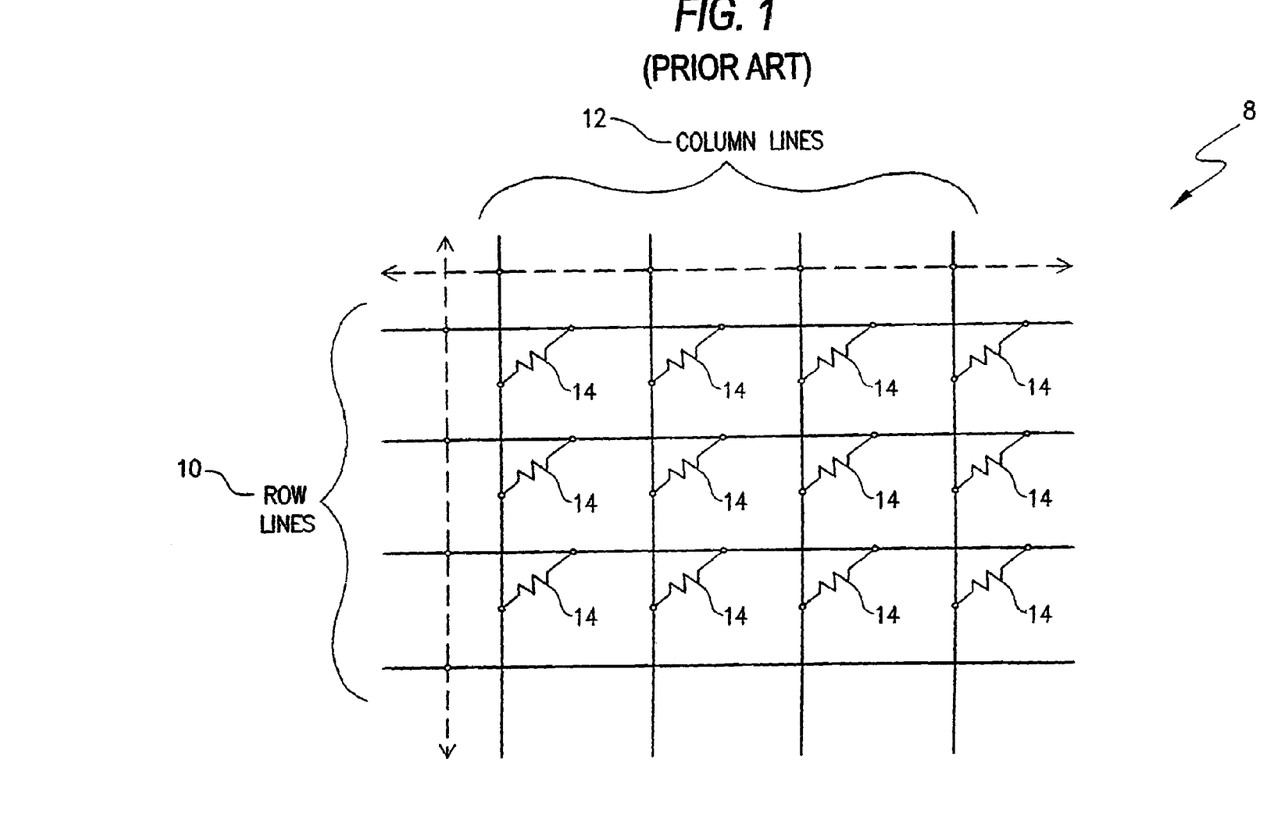
FIG. 1 shows a conventional magnetic random access memory array in electrical schematic form.

FIG. 1 shows one example of a resistor based memory. The memory includes a memory cell array 8 having a plurality of row lines 10 arranged in normal orientation to a plurality of column lines 12. Each row line is connected to each of the column lines by a respective resistor 14.

A Magnetic Random Access Memory (MRAM) is one approach to implementing a resistor based memory. In an MRAM, each resistive memory cell includes a magnetizable film. The resistance of the cell varies, depending on the magnetization state of the film. Logical data can be stored by magnetizing the film of particular cells so as to represent the logic states of the data. One resistance value, e.g., the higher value, may be used to signify a logic "HIGH" while the other resistance value, e.g., the lower value, may be used to signify a logic "LOW". The stored data can be read by measuring the resistance of the cells, and interpreting the resistance values thus measured as logic states of the data.

For MRAM sensing purposes, the absolute magnitude of resistance need not be known; only whether the resistance is above or below a value that is intermediate to the logic high and logic low values. Nonetheless sensing the logic state of an MRAM memory element is difficult because the technology of the MRAM device imposes multiple constraints. In a typical MRAM device an element in a high resistance state has a resistance of about 1MΩ. An element in a low resistance state has a resistance of about 950KΩ. The differential resistance between a logic one and a logic zero is thus about 50KΩ, or 5% of scale. Rapidly distinguishing a 5% resistance differential on a scale of 1MΩ with a minimum of circuitry is problematic.

Figure 2:
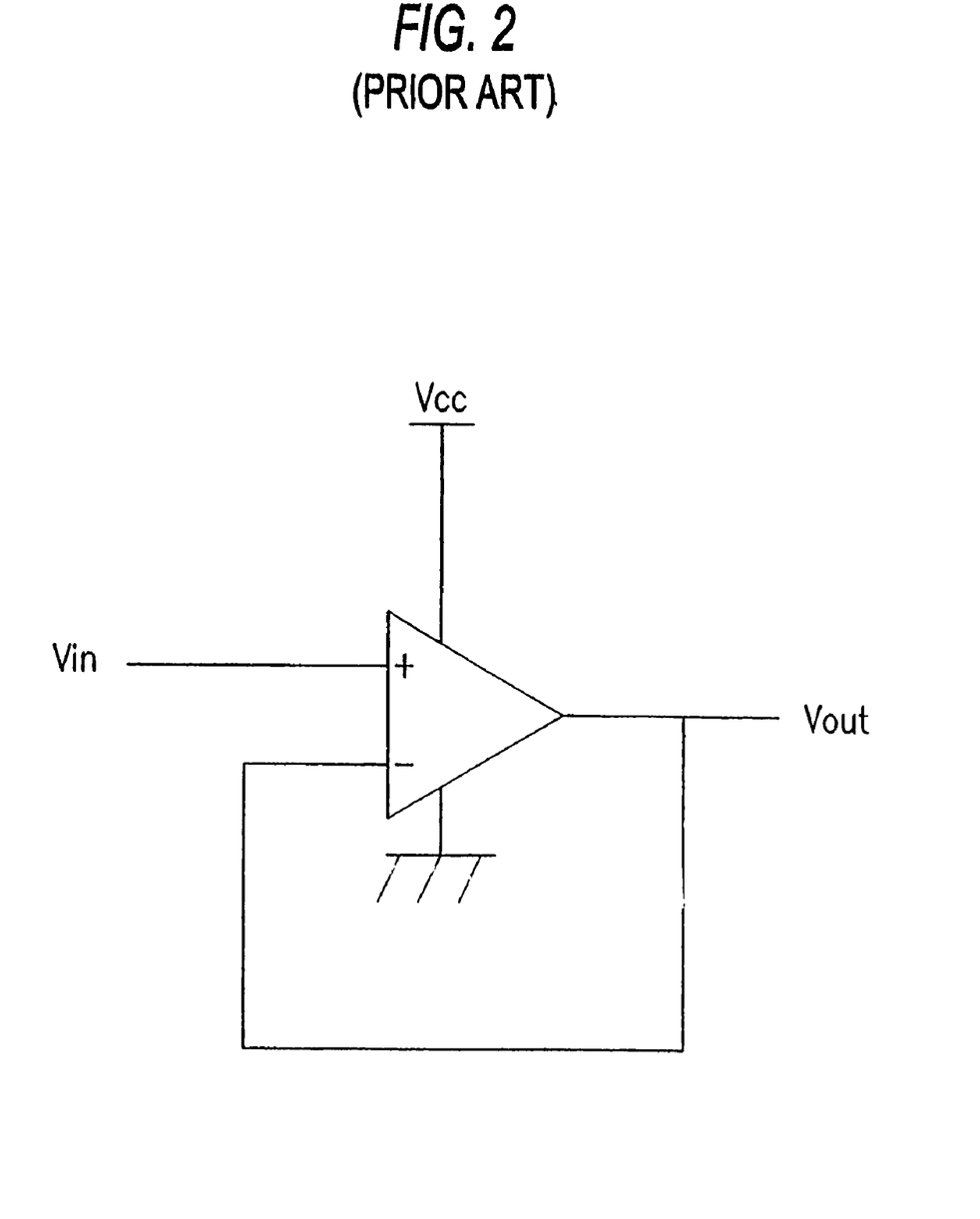
FIG. 2 shows a conventional voltage follower circuit including a differential amplifier in block diagram form.

Resistance is measured using Ohm's Law which holds that resistance is equal to the voltage across a resistor divided by the current through the resistor. Generally one parameter is held constant while the other is measured. In MRAM applications voltage is typically held constant while current is measured. As a result, the quality of an MRAM resistance measurement depends in large part upon the ability to regulate the voltage applied across a resistive memory element during sensing.

Where a stabilized voltage is required, it is known to use a voltage follower circuit constructed by feeding back an output signal of a differential amplifier to an inverting input of the amplifier, and connecting a reference voltage to the non-inverting input of the amplifier. FIG. 2 shows one embodiment of a conventional voltage follower in block diagram form. A voltage follower exhibits a voltage gain of about 1, high input impedance, and low output impedance. A voltage follower circuit might thus be used to apply a voltage across a resistive memory element to sense the resistance of the resistor.

In practice, a conventional differential amplifier, such as might be found in a memory device, has offsets that affect the voltage across the memory cell. If an amplifier with an offset is used to provide a voltage across a MRAM resistive memory element for sensing purposes, the presence of the voltage offset in the differential amplifier reduces the accuracy of the voltage applied across the memory cell, and consequently the precision with which the logic state of the cell is read. Therefore, there is a need for an improved voltage source circuit that is readily implemented on an integrated circuit, that requires few components, that operates at high speeds, and that provides a highly accurate and stable voltage output and a current output appropriate to support MRAM memory element sensing.

BRIEF SUMMARY OF THE INVENTION

The present invention provides a method and apparatus for measuring the resistance of a resistive memory element. The resistance is measured by applying a controlled voltage across a resistive memory element and ascertaining the level of current that consequently flows through the resistive memory element. According to the present invention, an improved differential amplifier, including a compensation circuit, is used in a feedback configuration to set a standard voltage across a resistive memory element. The compensation circuit reduces the effect of differential amplifier offset and yields a more precise standard voltage across the resistive memory element.

In one aspect, the invention includes a memory element voltage supply including a transistor with a gate adapted to control an electrical current through the transistor in relation to a voltage applied to the gate. The transistor also includes a source (or drain depending on device polarity) operatively connected to the resistive memory device. The voltage supply includes a differential amplifier with a non-inverting input operatively connected to a source of a reference voltage, an inverting input, a first output switchingly connected to the gate of the transistor, and a second output. The supply further includes a compensation amplifier with a third input adapted to receive and store a first compensation voltage, a third output operatively connected to the first output, and a fourth output operatively connected to the second output. Also included is a feedback line including a switch adapted to switchingly connect the second input to the source (or drain) of the transistor.

In operation the voltage supply first enters a calibration phase. During the calibration phase, a first compensation voltage is stored at the third input of the compensation amplifier. Generally, this third input includes a capacitor which is charged to store the first compensation voltage. The compensation voltage stored reflects the magnitude of an offset voltage that exists in the differential amplifier when no differential voltage is applied across its inputs; that is, the compensation voltage reflects an error that exists in the output of the differential amplifier. After the calibration phase, the voltage supply enters a measurement phase. In the measurement phase the error voltage, stored on the capacitor, is used as an input to the compensation amplifier. The resulting output of the compensation amplifier counteracts the erroneous offset voltage that would otherwise be included in the output of the differential amplifier. As a result of this corrective action, the output of the differential amplifier is more accurate, and a more precise measurement may be made of the resistance of the resistive memory element than would otherwise be possible.

These and other aspects and features of the invention will be more clearly understood from the following detailed description which is provided in conjunction with the accompanying drawings.

DETAILED DESCRIPTION OF THE INVENTION

Figure 3:
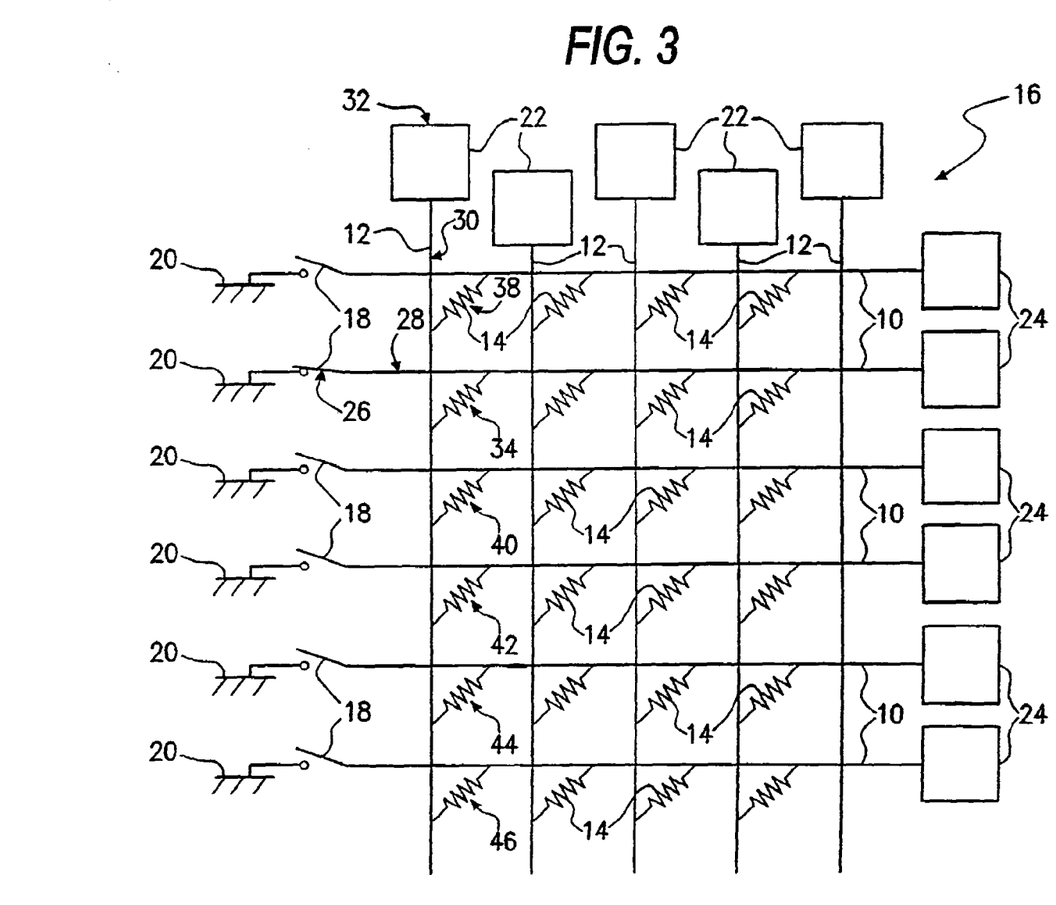
FIG. 3 shows a portion of a magnetic random access memory device according to one aspect of the invention in electrical schematic form.

FIG. 3 shows a resistive memory device according to one aspect of the invention. In the embodiments illustrated herein the resistive memory is referred to as MRAM memory; however, the invention is applicable to any type of resistance memory and is not limited to MRAM memory. The device includes an array 16 of Magnetic Random Access Memory (MRAM) elements, a plurality of electrically conductive row lines 10, and a plurality of electrically conductive column lines 12. Each row line is connected to each of the plurality of column lines by a respective MRAM resistive element 14. A plurality of switches 18, typically implemented as transistors, are each switchingly connected between one of the row lines and a first source of constant potential (ground) 20. A plurality of sensing circuits 22 are respectively connected to the plurality of column lines 12. Each sensing circuit 22 includes a source of constant electrical potential ($V_A$). According to the invention, the precision of this source of constant electrical potential ($V_A$) is improved with a compensation circuit.

A separate plurality of pull-up voltage sources 24 are respectively connected to each of the plurality of row lines 10. These supply voltage ($V_A$) to the row lines 10. These pull-up voltage sources 24 serve to maintain the ungrounded row lines at array voltage ($V_A$), thereby preventing leakage current through so-called sneak resistance. Optionally, the voltage compensation method of the present invention may be applied to the plurality of pull-up voltage sources 24 attached to the row lines 10 respectively.

In operation, an exemplary switch 18, such as switch 26 associated with a particular row line 28, is closed so as to bring that row line to ground potential and a particular column line 12, for example column line 30, is used by a respective sensing circuit 32 to read the resistance value of resistor 34.

Figure 4:
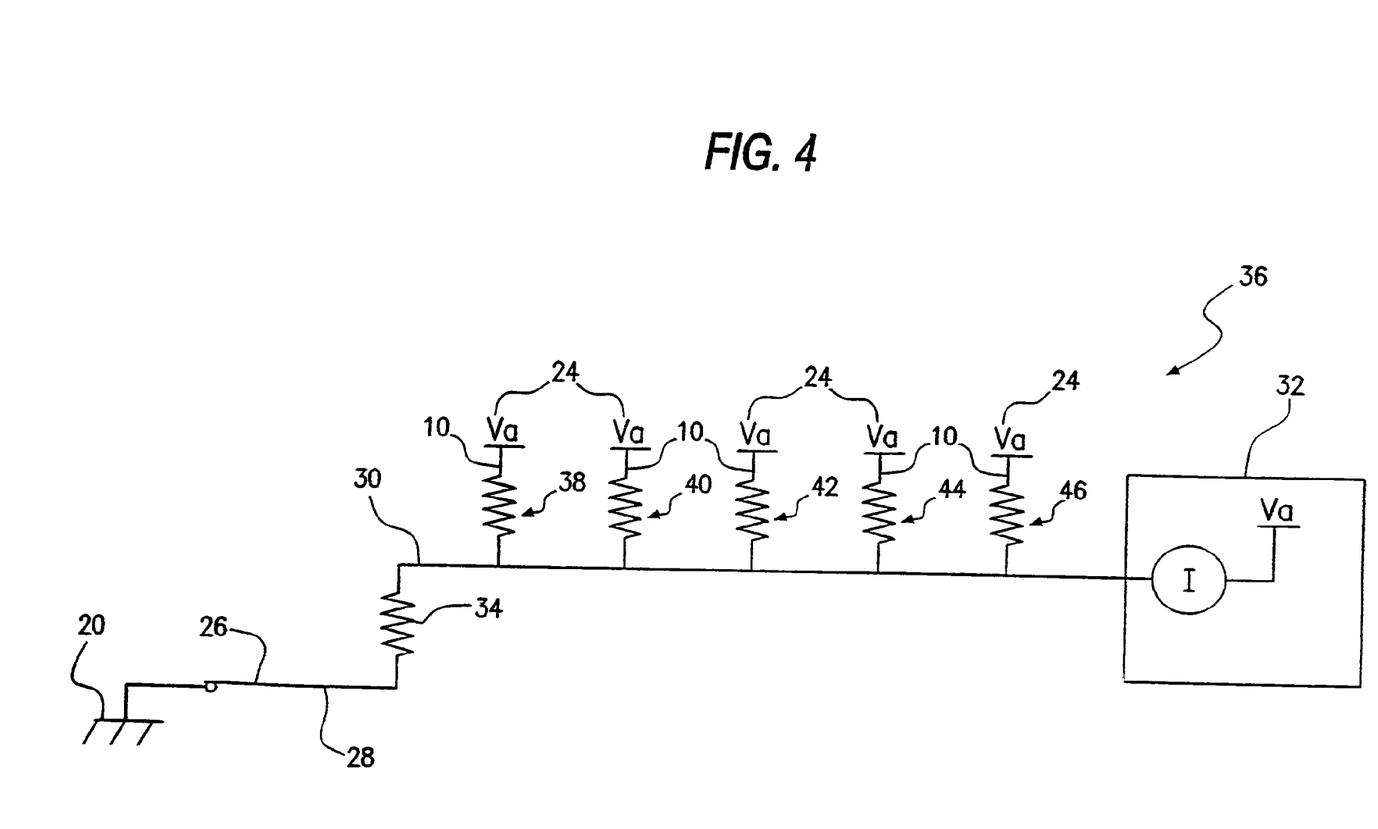
FIG. 4 shows a portion of a magnetic random access memory device according to one aspect of the invention including a sensing circuit and sneak resistance.

FIG. 4, shows the resulting electrical circuit for the relevant portion 36 of the memory array when row 28 and column 30 are activated. As shown, memory element 34 is connected between a grounded row line 28 and a particular column line 30. Also connected to the column line 30 are a plurality of other resistive memory elements (e.g., elements 38, 40, 42, 44, 46) each of which is connected at its opposite end to a source of electrical potential ($V_A$) 24 through a respective row line 10. In addition, a respective sensing circuit 32 is connected to the column line 30. The sensing circuit 32 includes a voltage supply, according to the present invention, that maintains the column line 30 at electrical potential ($V_A$). The other resistive memory elements (those tied to ungrounded row lines) 38, 40, 42, 44, 46, form an equivalent resistance referred to earlier as sneak resistance. The effective resistance of the sneak resistance is small. A typical value for sneak resistance might be one KΩ. Nevertheless, because both ends of each ungrounded resistor are ideally maintained at the same potential (here $V_A$), net current flow through the sneak resistance is desirably nearly zero. Precise voltage regulation across the sneak resistance is therefore important, since any voltage differential across the sneak resistance results in an unwanted current flow through the sneak resistance that reduces measurement precision and increases power consumption and thermal losses. In contrast, a measurable current desirably flows through the grounded resistive memory element 34. This current allows measurement of the resistance of the memory element 34 by the sensing circuit 32.

Figure 5:
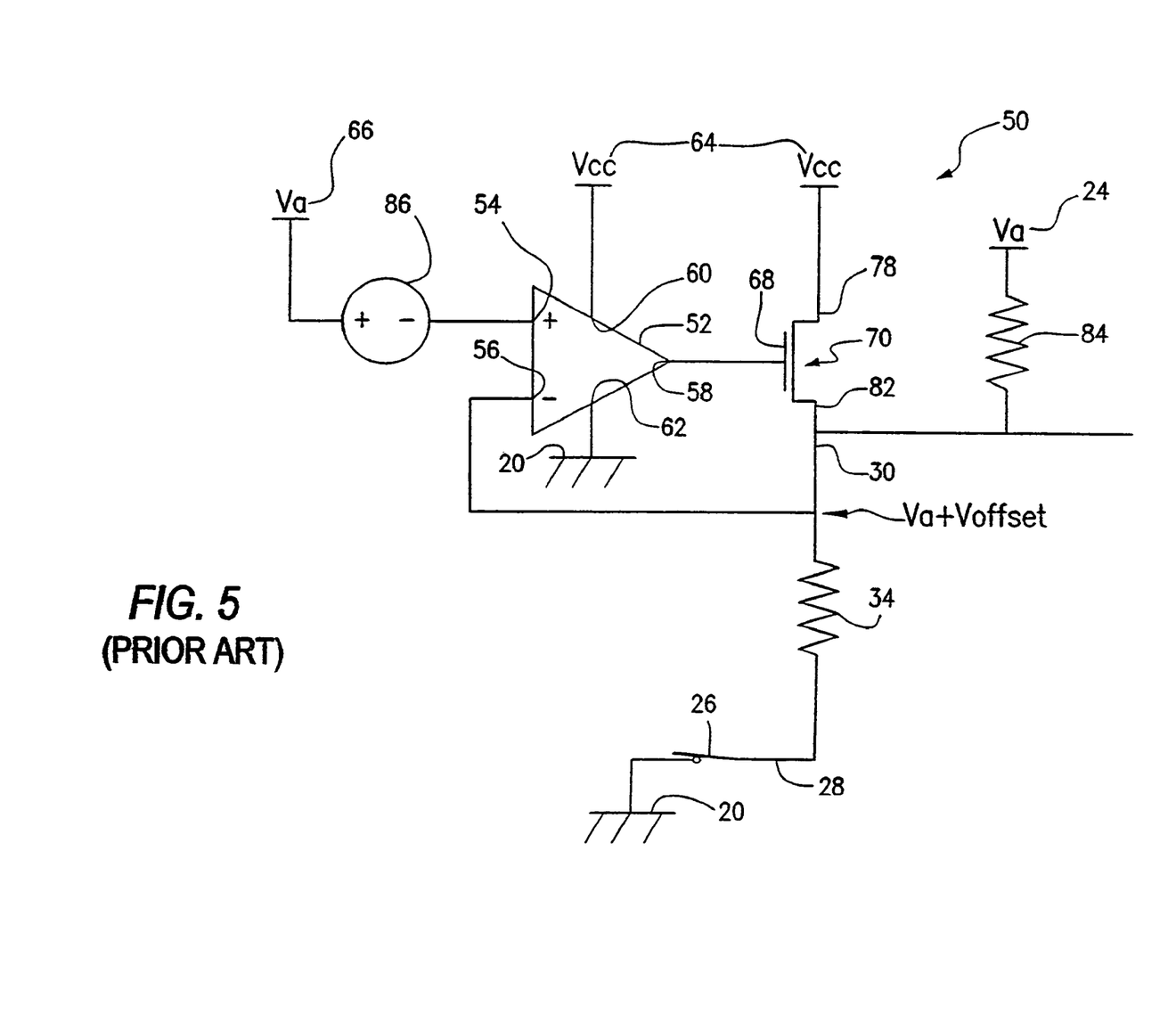
FIG. 5 shows a conventional voltage follower circuit including a differential amplifier and a transistor for applying a sensing voltage to a resistive memory element.

FIG. 5 shows a conventional circuit 50 for applying a sensing voltage across a resistive memory element. A differential amplifier 52 is provided, including a non-inverting input 54, an inverting input 56, and an output 58. Also shown are supply 60 and ground 62 connections of the differential amplifier connected to a source of supply (VCC) 64 and a ground 20 respectively (note that in an alternative embodiment, the differential amplifier might be connected for power between two non-ground potentials). The non-inverting input 54 of the differential amplifier is operatively connected to a source of a reference voltage ($V_A$) 66. The output 58 of the differential amplifier is operatively connected to a gate 68 of a transistor 70. As would be understood by one of skill in the art, transistors of various polarities may be employed, and the output signal of the differential amplifier inverted accordingly. As shown, an enhancement mode NMOS field effect transistor is used. A drain 78 of the transistor is connected to a power supply (VCC) 64 and a source 82 of the transistor is connected to a column line 30 which is, in turn, connected to one end of a resistive memory element 34. The other end of the resistive memory element 34 is connected to a row line 28 that is switchingly connected to a ground potential 20 by a switch 26. The column line 30 is also connected to the inverting input 56 of the differential amplifier 52 and to the sneak resistance collectively indicated as 84. In operation an output signal of the differential amplifier controls the gate 68 of the transistor to maintain a voltage ideally equal to the reference voltage ($V_A$) 66 on the column line 30.

In practice, offsets within the differential amplifier result in a voltage at the column line 30 that deviates from that of the reference voltage 66. The offset within the differential amplifier is represented in FIG. 5 by a voltage 86 applied to or subtracted from the non-inverting input 54 of the differential amplifier.

Figure 6:
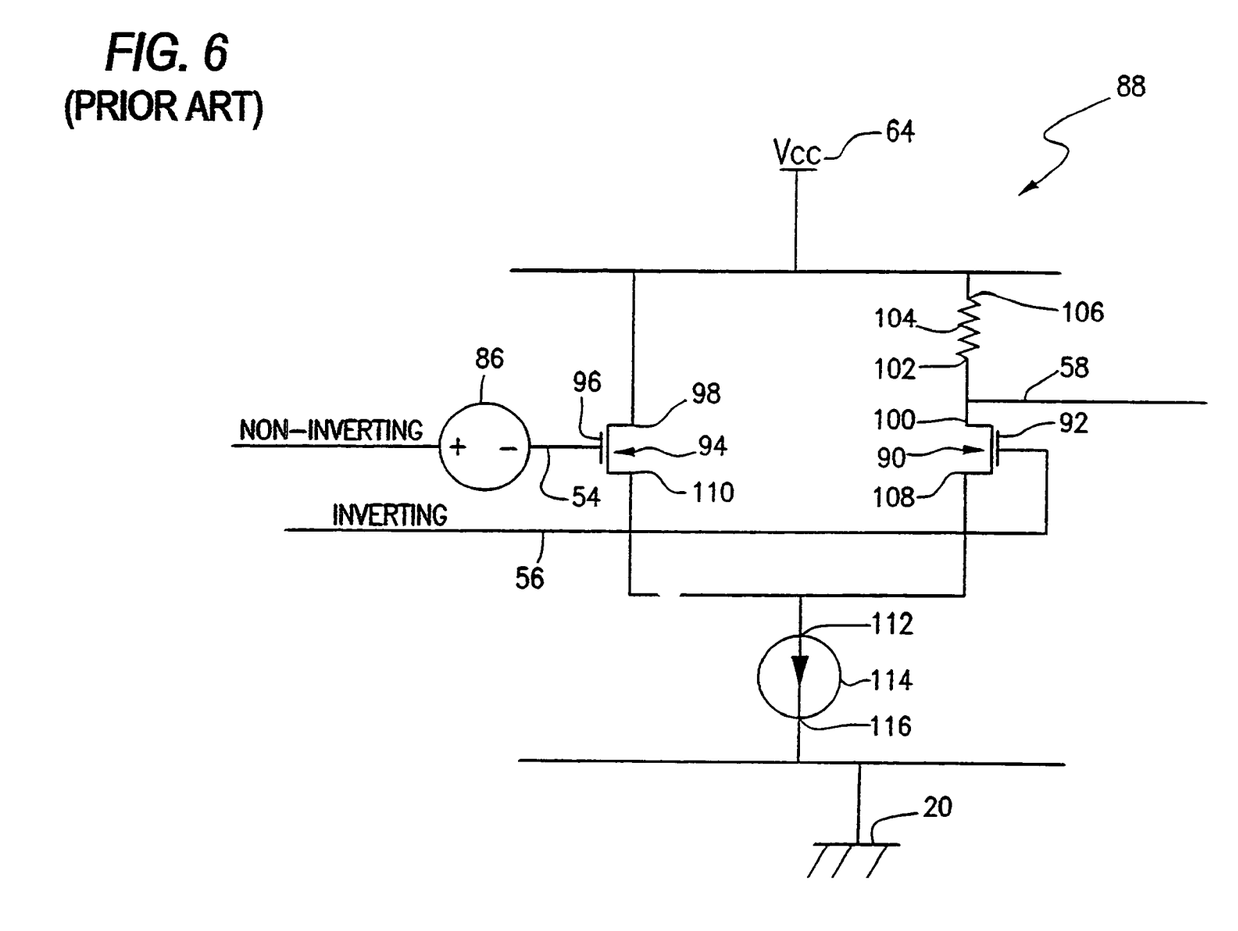
FIG. 6 shows a conventional circuit for a differential amplifier in electrical schematic form.

FIG. 6 shows a schematic representation of a circuit 88 of a conventional differential amplifier used as differential amplifier 52. The circuit includes an output connection 58 an inverting transistor 90 including a gate 92 connected to an inverting input 56 and a non-inverting transistor 94 including a gate 96 connected to a non-inverting input 54. The drain 98 of the non-inverting transistor 94 is operatively connected to the source of supply voltage (VCC) 64. The drain 100 of the inverting transistor 90 is operatively connected to the output 58 of the differential amplifier, and also to one end 102 of a pull-up resistor 104. The other end 106 of the pull-up resistor is connected to the source of supply (VCC) 64. First 108 and second 110 source connections of the inverting 90 and non-inverting 94 transistors respectively are connected in common to a first terminal 112 of a current source 114. A second terminal 116 of the current source 114 is connected to ground 20. Also shown is a voltage source 86 representing, a +/− offset within the differential amplifier 88. Note that although offset voltage is represented throughout the present disclosure as a lumped voltage source, this is a simplified representation. Actually offsets may arise from a variety of causes and components distributed within the electrical components of the resistance measurement voltage supply.

Figure 7:
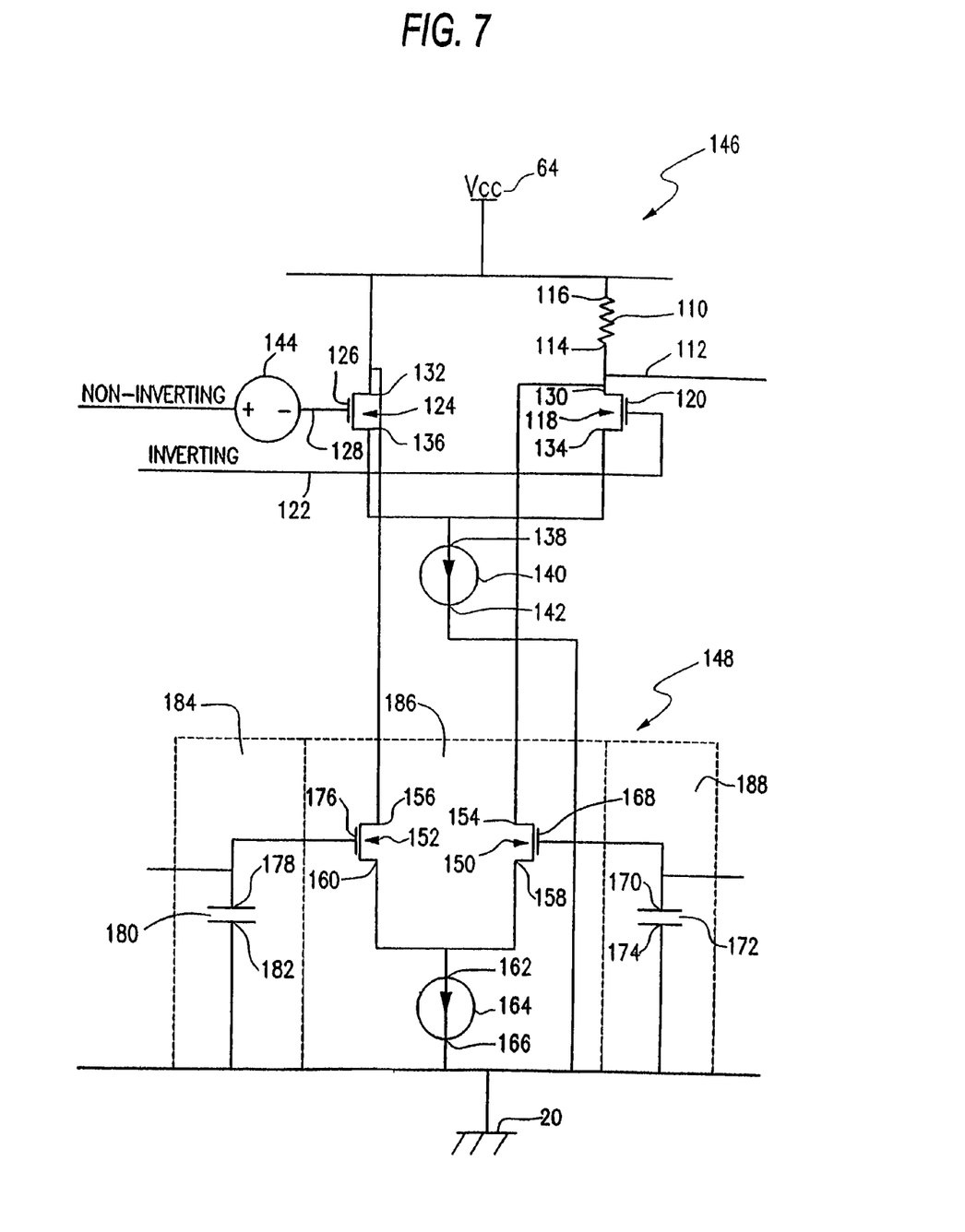
FIG. 7 shows a circuit for a differential amplifier according to one aspect of the invention including components for offset voltage compensation.

FIG. 7 shows a compensated differential amplifier circuit according to one aspect of the invention. The circuit includes an operative connection to a source of supply voltage (VCC) 64, a pull-up resistor 110 and an output connection 112. The output connection 112 is connected to one end 114 of the pull-up resistor 110. The other end 116 of the pull-up resistor is operatively connected to the source of supply voltage (VCC) 64. The amplifier also includes an inverting transistor 118 with a gate 120 connected to an inverting input 122 and a non-inverting transistor 124 including a gate 126 connected to a non-inverting input 128. A drain 130 of the inverting transistor 118 is connected to the output 112 of the amplifier. A drain 132 of the non-inverting transistor 124 is operatively connected to the source of supply voltage (VCC) 64. Optionally, the drain 132 of the non-inverting transistor may be available on a complementary output. First 134 and second 136 source connections of the inverting 118 and non-inverting 124 transistors respectively are connected in common to a first terminal 138 of a first current source 140. A second terminal 142 of the first current source 140 is connected to ground 20. Also shown is a voltage source 144 representing, a +/− offset within the differential amplifier 146. As discussed above, although offset voltage 144 is shown as a lumped voltage source, this is a simplified representation. Offsets at the output of the differential amplifier 146 may result from various causes such as component asymmetry within the differential amplifier 146.

According to one aspect of the invention, the amplifier 146 includes an offset compensation circuit 148 in the form of a second differential amplifier. The offset compensation circuit 148 includes a first compensation transistor 150 and a second compensation transistor 152. The drain 154 of the first compensation transistor 150 is operatively connected to the drain 130 of the inverting transistor 118, and consequently to the output 112 of the differential amplifier 146. The drain 156 of the second compensation transistor 152 is operatively connected to the drain 132 of the non-inverting transistor 124. A source connection 158 of the first compensation transistor 150 and a source connection 160 of the second compensation transistor 152 are connected in common to a first terminal 162 of a second current source 164. A second terminal 166 of the second current source 164 is connected to ground 20. A gate 168 of the first compensation transistor 150 is connected to a first terminal 170 of a first compensation capacitor 172. A second terminal 174 of the first compensation capacitor 172 is connected to ground 20. A gate 176 of the second compensation transistor 152 is connected to a first terminal 178 of a second compensation capacitor 180. A second terminal 182 of the second compensation capacitor 180 is connected to ground 20.

Figure 8:
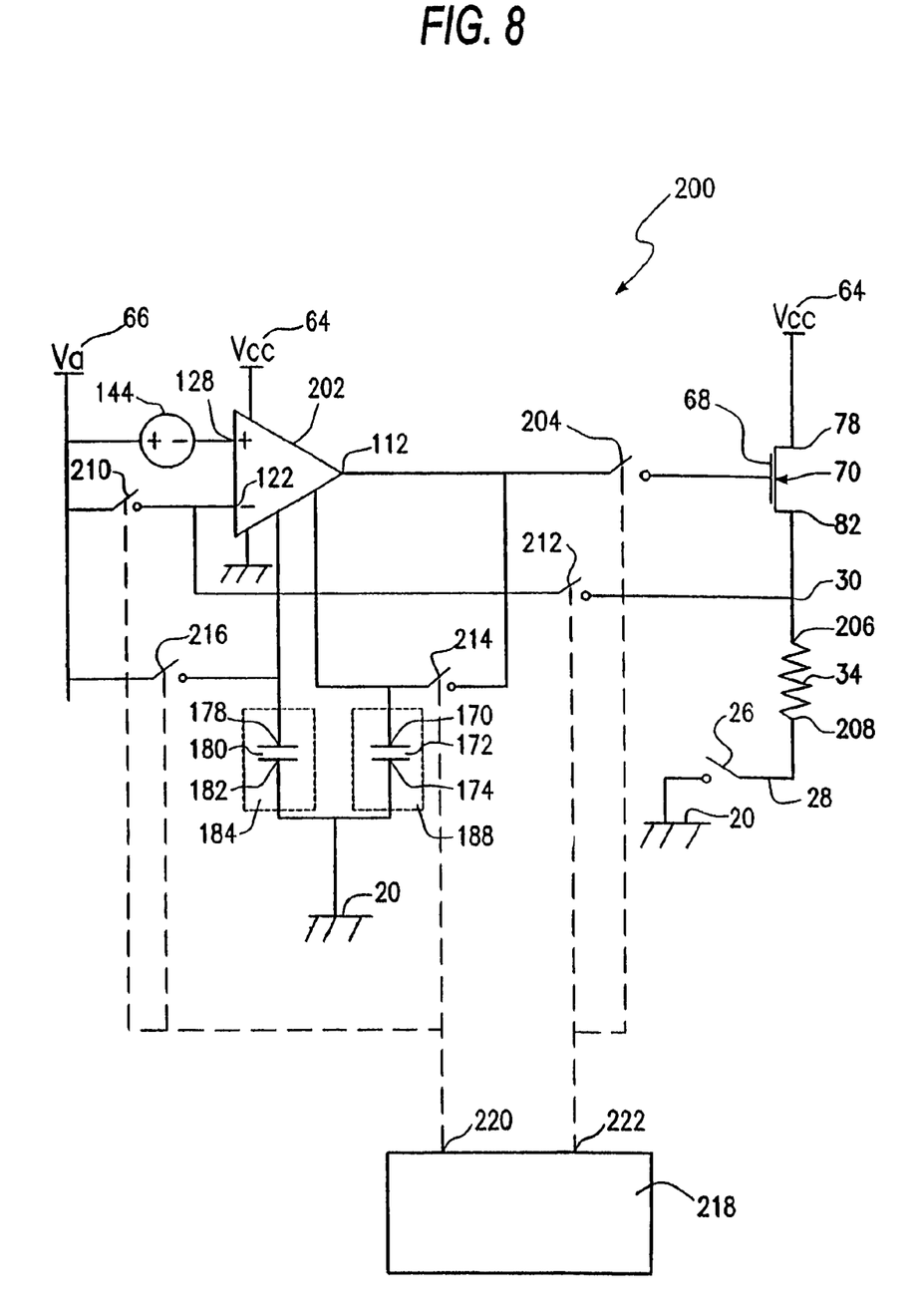
FIG. 8 shows, in block diagram form, a circuit according to one aspect of the invention for applying a standard voltage across a resistive memory element.

FIG. 8 shows an operational connection 200 of the differential amplifier of FIG. 7 according to one aspect of the invention. As shown in FIG. 8, the amplifier 146 of FIG. 7 is represented as an amplifier block 202 and includes the portion of compensation circuit 148 identified in FIG. 7 as 186. The first 172 and second 180 compensation capacitors and their mutual connection to ground 20, shown in FIG. 7 as portions 184, 188 of FIG. 7 are shown externally in FIG. 8. According to the invention, the output 112 of the differential amplifier 202 is connected through a switch 204 to a gate 68 of a control transistor 70. The control transistor includes a drain 78 connected to a power supply (VCC) 64 and a source 82 connected to a column line 30 of a resistive memory integrated circuit device. The column line 30 is connected to one terminal 206 of a resistive memory element 34. The resistive memory element includes a second terminal 208 connected to a row line 28 that is switchingly connected to ground 20 through a switch 26. The differential amplifier 202 includes a non-inverting input 128 operatively connected to a source of a reference voltage 66. The amplifier 202 also includes an inverting input 122 connected by means of a switch 210 to the same reference voltage ($V_A$) 66. The inverting input 122 also is switchingly connected by means of a second switch 212 to the column line 30. The first terminal 170 of the first compensation capacitor 172 is also switchingly connected by means of a further switch 214 to the output 112 of the differential amplifier 202. The first terminal 178 of the second compensation capacitor 180 is switchingly connected by means of a further switch 216 to the reference voltage source ($V_A$) 66. As noted above, the second terminals 174 and 182 of the first compensation capacitor 172 and of the second compensation capacitor 180 respectively are connected to ground 20.

A control circuit 218, which may be external to the amplifier 202, controls switches 204, 210, 212, 214, 216 to switch the amplifier between a calibration mode configuration, and a resistive element measurement mode configuration. The control circuit 218 includes a first phase output 220 operatively connected to switches 210, 214, and 216. The control circuit 218 includes a second phase output 222 operatively connected to switches 204 and 212.

In operation, the differential amplifier circuit shown in FIG. 8 switches between two modes; a calibration mode, or a resistance measurement mode.

Figure 9:
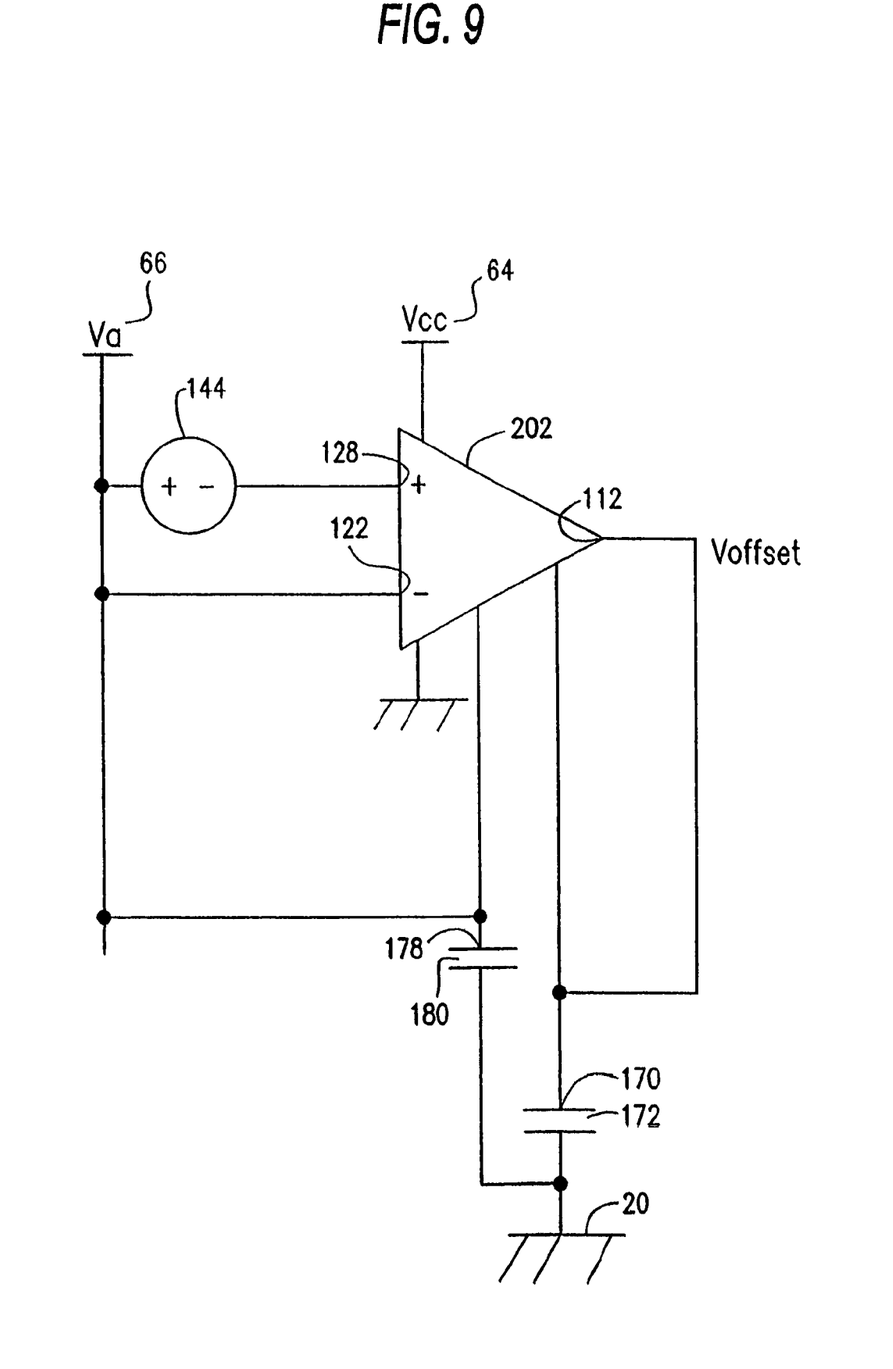
FIG. 9 shows, in block diagram form, the configuration of a circuit according to one aspect of the invention during calibration phase.

In a calibration mode, switches 204 and 212 are open; switches 210, 214 and 216 are closed. Generally speaking, the switches 204, 210, 212, 214, and 216 (FIG. 8) are implemented as transistors, and are operated under the control of control circuitry 218. Prior to sensing the stored value of a resistive memory element, the control circuitry 218 places the differential amplifier 202 in a calibration mode by opening switches 204 and 212, and closing switches 210, 214, and 216. FIG. 9 shows the resulting connection of the differential amplifier of the invention. The non-inverting 128 and inverting 122 inputs of the differential amplifier 202 are connected together and held at reference potential ($V_A$) 66. The first terminal 178 of the second capacitor 180 is also held at reference potential ($V_A$) 66. In this configuration, there is no differential voltage across the inputs 128, and 122, of the differential amplifier. Any voltage that appears on the output 112 is therefore an offset voltage and is, by definition, undesirable. Because the circuit is in a calibration mode configuration, this offset voltage is fed back through switch 214 to the first compensation capacitor 172. The first compensation capacitor 172 is charged by the differential amplifier until the voltage on the capacitor 172 is equal to the offset voltage at the output 112 of the differential amplifier 146. Thereafter, the control circuitry places the amplifier in the resistance measurement mode. Once the circuit is returned to measurement mode, this stored voltage acts to produce an inverse offset that negates the offset that would otherwise be present at the output 112 of the amplifier 202.

Figure 10:
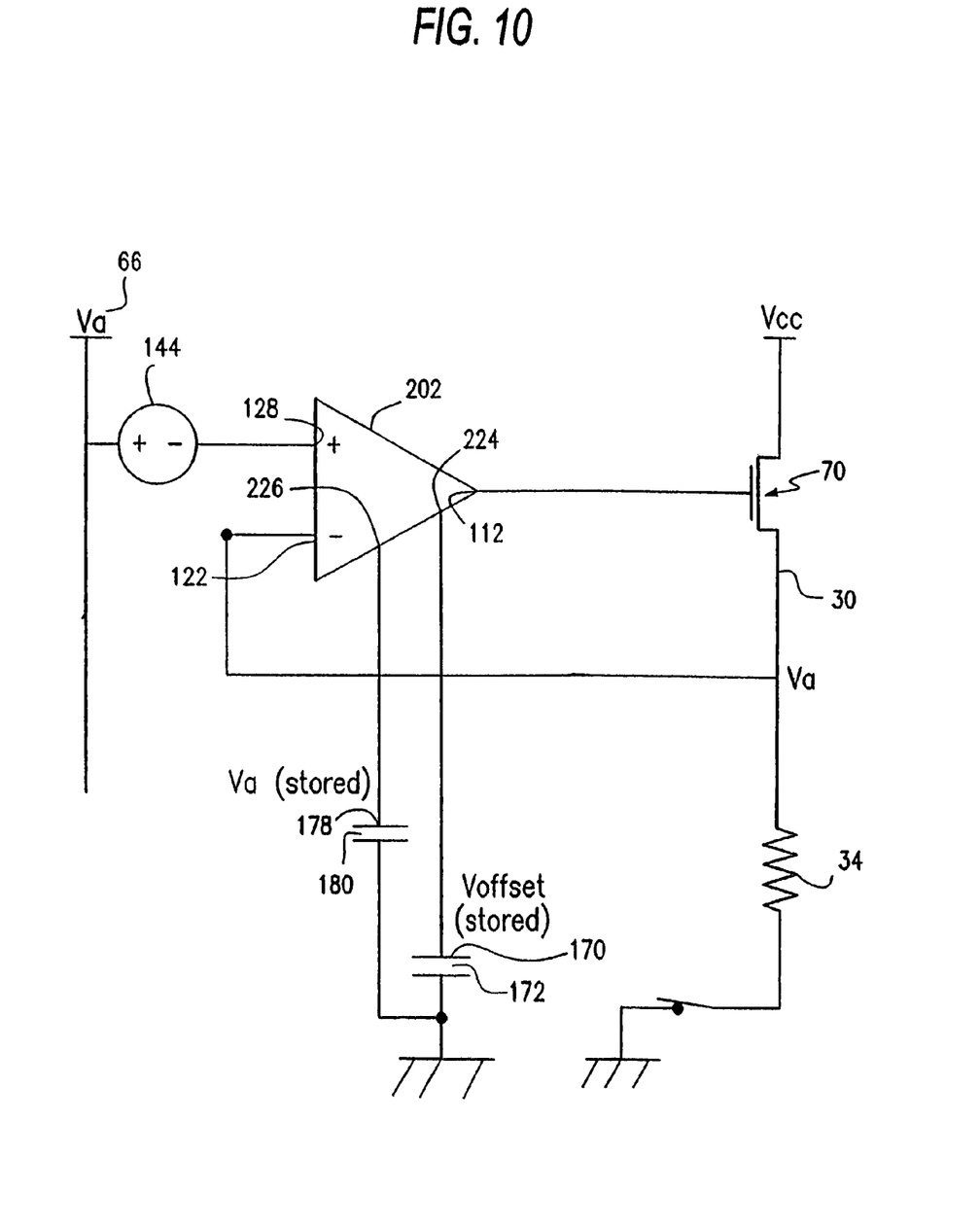
FIG. 10 shows, in block diagram form, a configuration of a circuit according to one aspect of the invention during measurement phase.

FIG. 10 shows the differential amplifier 202 connected for use in a resistance measurement mode. In resistance measurement mode, switches 210, 214, and 216 are open, and switches 204 and 212 are closed. The reference voltage ($V_A$) 66, plus the offset voltage 144 are applied to the non-inverting input 128 of the differential amplifier 202. The first compensation input 224 corresponds to the gate 168 of the first compensation transistor 150. Accordingly, the pre-charged first compensation capacitor 172 applies a stored voltage of (V offset) to the gate 168 of the first compensation transistor 150 (FIG. 7). The second compensation capacitor 180 exhibits pre-stored charge ($V_A$) that is applied to a second compensation input 226 of the differential amplifier. The second compensation input 226 corresponds to the gate 176 of the second compensation transistor 152. Accordingly, the pre-stored voltage ($V_A$) is applied to the gate 176 of the second compensation transistor 152 (FIG. 7). As a result, the first 150 and second 152 compensation transistors shunt current from the drains of the inverting 118 and non-inverting 124 transistors respectively to ground 20. This shunt current is just enough to adjust the voltage that appears on the output 112 of the amplifier 146 so as to substantially eliminate voltage offset from that output.

The combination of the compensated differential amplifier and the transistor 70 act to maintain a voltage ($V_A$) on column line 30, and accordingly across the resistive memory element 34 during measurement with minimized errors due to offsets in the differential amplifier 202. If the voltage on the column line 30 drops below ($V_A$), negative feedback into the inverting input 122 of the differential amplifier results in a signal to the gate 68 of the transistor that increases current flow through the transistor and returns the voltage of the column line 30 to voltage ($V_A$).

In one aspect, the control circuit 218 acts to place the amplifier in calibration mode at the beginning of every read cycle. In a variation, the control circuitry places the amplifier in calibration mode prior to a first read, and then returns the amplifier to calibration mode only after a predefined number of read cycles. In a further variation, the control circuit 218 places the amplifier in calibration mode prior to a first read cycle, and then returns the amplifier to calibration mode only after a definite value of voltage offset is sensed on the output 112.

Figure 11:
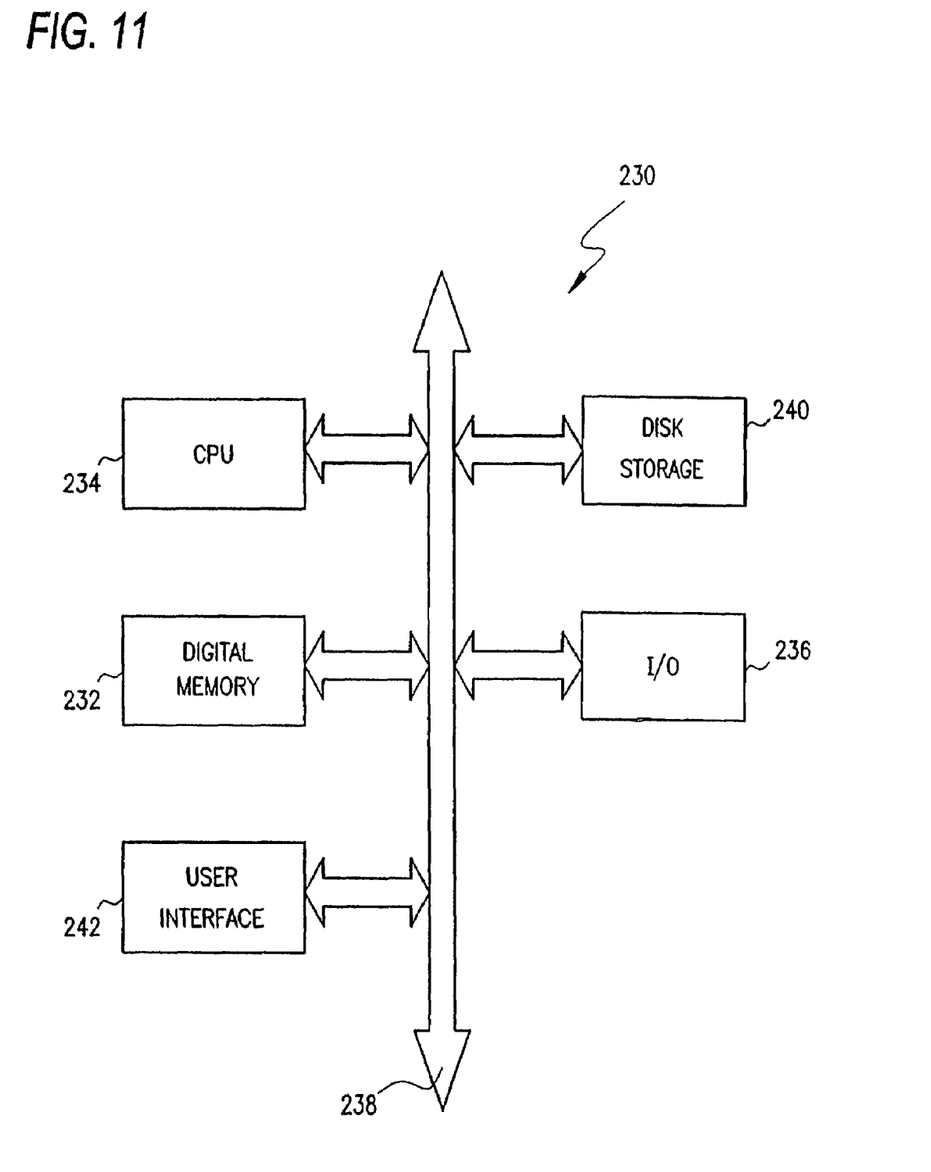
FIG. 11 shows, in block diagram form, a computer system incorporating a digital memory device including a compensated voltage source according to the present invention.

FIG. 11 shows a computer system 230 including a memory 232 including one or more resistive memory devices which are constructed to include the invention as described and illustrated with reference to FIGS. 7-9. The computer 230, as shown includes a central processing unit (CPU) 234, for example a microprocessor, that communicates with one or more input/output (I/O) devices 236 over a bus 238. The computer system also includes a peripheral device such as disk storage 240 and a user interface 242. It may be desirable to integrate the processor 234 and memory 232 on a single integrated circuit device. Other processing systems in which the invention, in different embodiments may be employed include radio systems, television systems, wireless, wired, and optical voice and data networks, global positioning system receivers, and other systems where digital data storage is required.

While preferred embodiments of the invention have been described in the illustrations above, it should be understood that these are exemplary of the invention and are not to be considered as limiting. Additions, deletion, substitution, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A voltage source for a resistive memory device, the resistive memory device having a plurality of row lines and resistive memory elements, the voltage source comprising:
    a pull-up voltage circuit for maintaining at least one row line at a predetermined array voltage, the pull-up voltage circuit comprising:
    a first differential amplifier operatively connected to a reference voltage; and
    a second differential amplifier operatively connected to a compensation voltage and an output of the first differential amplifier.

2. The voltage source of claim 1, wherein the first differential amplifier comprises:
    a pull-up resistor electrically connected to a supply voltage;
    an output connected to the resistor;
    an inverting transistor connected to the output and controlled by an inverting input;
    a non-inverting transistor connected to the supply voltage and controlled by a non- inverting input;
    a first current source connected between the inverting and non-inverting transistors and ground; and
    an offset voltage source connected to a gate of the non-inverting transistor. transistor.

3. The voltage source of claim 2, wherein the second differential amplifier comprises:
    a first compensation transistor connected to the inverting transistor and the output of the first differential amplifier;
    a second compensation transistor connected to the non-inverting transistor;
    a second current source connected between the compensation transistors and ground;
    a first compensation capacitor connected to a gate of the first compensation transistor; and
    a second compensation capacitor connected to a gate of the second compensation transistor.

4. A compensated differential amplifier device comprising:
    a first differential amplifier comprising:
        a pull-up resistor electrically connected to a supply voltage;

an output electrically connected to the resistor;
an inverting transistor, the inverting transistor comprising:
   a gate connected to an inverting input;
   a first source/drain region electrically connected to the output; and
   a second source/drain region;
a non-inverting transistor comprising:
   a gate connected to a non-inverting input;
   a first source/drain region electrically connected to the supply voltage; and
   a second source/drain region;
a first current source comprising:
   a first terminal connected to the second source/drain region of the inverting transistor and the second source/drain connection of the non- inverting transistor; and
   a second terminal connected to ground; and
an offset voltage source connected to the gate of the non-inverting transistor; and
a second differential amplifier comprising:
   a first compensation transistor comprising:
      a first source/drain region electrically connected to the first source/drain region of the inverting transistor and to the output of the first differential amplifier;
      a second source/drain region; and
      a gate;
   a second compensation transistor comprising:
      a first source/drain region electrically connected to the first source/drain region of the non-inverting transistor;
      a second source/drain region; and
      a gate;
   a second current source comprising:
      a first terminal connected to the second source/drain region of the inverting transistor and the second source/drain connection of the non- inverting transistor; and
      a second terminal connected to ground; and
   a first compensation capacitor comprising:
      a first terminal electrically connected to the gate of the first compensation transistor; and
      a second terminal connected to ground; and
   a second compensation capacitor comprising:
      a first terminal electrically connected to the gate of the second compensation transistor; and
      a second terminal connected to ground.

5. The compensated differential amplifier device of claim 4, wherein a second source/drain region of the non-inverting transistor is connected to a complementary output.

6. A control circuit for controlling an amplifier in a resistive memory device, the control circuit comprising:
   a first phase output operatively connected to a first plurality of switches; and
   a second phase output operatively connected to a second plurality of switches,
   wherein the control circuit is operable to alternate between a calibration mode configuration and a resistive element measurement mode configuration.

7. The control circuit of claim 6, wherein the control circuit is operable to place the amplifier in the calibration mode at the beginning of each read cycle.

8. The control circuit of claim 6, wherein the control circuit is operable to place the amplifier in the calibration mode prior to a first read, and then operable to return the amplifier to the calibration mode only after a predefined number of read cycles.

9. The control circuit of claim 6, wherein the control circuit is operable to place the amplifier in the calibration mode prior to a first read cycle, and then operable to return the amplifier to the calibration mode only after a definite value of voltage offset is sensed on an output.

* * * * *

UNITED STATES PATENT AND TRADEMARK OFFICE
CERTIFICATE OF CORRECTION

| | | |
|---|---|---|
| PATENT NO. | : 7,616,474 B2 | Page 1 of 1 |
| APPLICATION NO. | : 11/898890 | |
| DATED | : November 10, 2009 | |
| INVENTOR(S) | : Baker | |

It is certified that error appears in the above-identified patent and that said Letters Patent is hereby corrected as shown below:

In column 1, line 6, delete "7,286,428" and insert -- 7,286,428, --, therefor.

In column 8, line 49, in Claim 2, delete "transistor. transistor." and insert -- transistor. --, therefor.

In column 9, line 28, in Claim 4, delete "agate;" and insert -- a gate; --, therefor.

Signed and Sealed this

Nineteenth Day of January, 2010

David J. Kappos
*Director of the United States Patent and Trademark Office*